United States Patent
Huang et al.

(10) Patent No.: US 9,978,715 B2
(45) Date of Patent: May 22, 2018

(54) SEMICONDUCTOR PACKAGE STRUCTURE AND SEMICONDUCTOR PROCESS

(71) Applicant: Advanced Semiconductor Engineering, Inc., Kaohsiung (TW)

(72) Inventors: Shih-Ming Huang, Kaohsiung (TW); Chun-Hung Lin, Kaohsiung (TW); Yi-Ting Chen, Kaohsiung (TW); Wen-Hsin Lin, Kaohsiung (TW); Shih-Wei Chan, Kaohsiung (TW); Yung-Hsing Chang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 8 days.

(21) Appl. No.: 14/303,421

(22) Filed: Jun. 12, 2014

(65) Prior Publication Data
US 2014/0367841 A1 Dec. 18, 2014

(30) Foreign Application Priority Data

Jun. 14, 2013 (TW) .............................. 102121211 A
Dec. 27, 2013 (TW) .............................. 102148836 A

(51) Int. Cl.
*H01L 23/28* (2006.01)
*H01L 23/00* (2006.01)
(Continued)

(52) U.S. Cl.
CPC ............ *H01L 24/97* (2013.01); *H01L 23/295* (2013.01); *H01L 23/49816* (2013.01);
(Continued)

(58) Field of Classification Search
CPC . H01L 24/97; H01L 23/295; H01L 23/49816; H01L 23/49833
(Continued)

(56) References Cited

U.S. PATENT DOCUMENTS 5,889,326 A * 3/1999 Tanaka ........................ 257/737
6,733,901 B2 * 5/2004 Takasaki et al. ............. 428/620
(Continued)

FOREIGN PATENT DOCUMENTS

CN 1384143 A 12/2002
CN 102915984 2/2013
(Continued)

OTHER PUBLICATIONS

Office Action and Search Report received for Taiwan Patent Application No. 102148836; 7 pages with English translation of Search Report, dated Dec. 17, 2015.
(Continued)

*Primary Examiner* — Nitin Parekh
(74) *Attorney, Agent, or Firm* — Foley & Lardner LLP; Cliff Z. Liu

(57) ABSTRACT

The present disclosure relates to a semiconductor package structure and semiconductor process. The semiconductor package includes a first substrate, a second substrate, a die, a plurality of interconnection elements and an encapsulation material. Each of the interconnection elements connects the first substrate and the second substrate. The encapsulation material encapsulates the interconnection elements. The encapsulation material defines a plurality of accommodation spaces to accommodate the interconnection elements, and the profile of each accommodation space is defined by the individual interconnection element, whereby the warpage behavior of the first substrate is in compliance with that of the second substrate during reflow.

16 Claims, 7 Drawing Sheets

(51) Int. Cl.
*H01L 23/29* (2006.01)
*H01L 23/498* (2006.01)
*H01L 21/56* (2006.01)

(52) U.S. Cl.
CPC ...... *H01L 23/49833* (2013.01); *H01L 21/561* (2013.01); *H01L 24/16* (2013.01); *H01L 2224/16227* (2013.01); *H01L 2224/97* (2013.01); *H01L 2924/00014* (2013.01); *H01L 2924/12042* (2013.01); *H01L 2924/15331* (2013.01); *H01L 2924/181* (2013.01)

(58) Field of Classification Search
USPC .................................. 257/737, 778, E23.021
See application file for complete search history.

(56) References Cited

U.S. PATENT DOCUMENTS

| | | | |
|---|---|---|---|
| 6,828,665 B2 | 12/2004 | Pu et al. | |
| 7,049,692 B2 | 5/2006 | Nishimura et al. | |
| 7,282,806 B2 * | 10/2007 | Hembree et al. | 257/787 |
| 7,345,361 B2 | 3/2008 | Mallik et al. | |
| 7,381,359 B2 * | 6/2008 | Yan | C08G 59/24 257/787 |
| 7,642,133 B2 | 1/2010 | Wu et al. | |
| 7,772,687 B2 | 8/2010 | Inoue | |
| 7,777,351 B1 | 8/2010 | Berry et al. | |
| 7,989,707 B2 | 8/2011 | Yamano et al. | |
| 8,012,797 B2 | 9/2011 | Shen et al. | |
| 8,106,495 B2 | 1/2012 | Kajiki | |
| 8,106,499 B2 | 1/2012 | Camacho et al. | |
| 8,143,101 B2 | 3/2012 | Sun et al. | |
| 8,319,338 B1 | 11/2012 | Berry et al. | |
| 8,330,277 B2 | 12/2012 | Machida | |
| 8,405,212 B2 | 3/2013 | Chu et al. | |
| 8,779,606 B2 * | 7/2014 | Yim et al. | 257/790 |
| 2004/0262774 A1 * | 12/2004 | Kang | H01L 21/563 257/777 |
| 2007/0290376 A1 * | 12/2007 | Zhao et al. | 257/787 |
| 2012/0049338 A1 | 3/2012 | Chen et al. | |
| 2012/0211885 A1 * | 8/2012 | Choi | H01L 23/3128 257/737 |
| 2013/0200534 A1 * | 8/2013 | Shiobara | H01L 21/78 257/787 |
| 2013/0270682 A1 * | 10/2013 | Hu et al. | 257/666 |

FOREIGN PATENT DOCUMENTS

| | | |
|---|---|---|
| TW | 201232735 A | 8/2012 |
| TW | 201240064 | 10/2012 |

OTHER PUBLICATIONS

Office Action for Chinese Patent Application No. 201410079763.X dated Jul. 5, 2016, including English translation of search report.

* cited by examiner

SEMICONDUCTOR PACKAGE STRUCTURE AND SEMICONDUCTOR PROCESS

CROSS REFERENCE TO RELATED APPLICATIONS

This application claims the benefit of Taiwan Patent Application No. 102121211, filed 14 Jun. 2013, and the benefit of Taiwan Patent Application No. 102148836, filed 27 Dec. 2013, the contents of which are incorporated herein by reference in their entireties.

BACKGROUND

1. Technical Field

The present disclosure relates to a semiconductor package structure and a semiconductor process, and more particularly to a stacked semiconductor package structure and a semiconductor process thereof.

2. Description of the Related Art

A conventional process of making a stacked semiconductor package structure begins with bonding a die and a plurality of solder balls to an upper surface of a lower substrate. Next, a molding process is used to form a molding material on the upper surface of the lower substrate to encapsulate the die and solder balls. Once the molding material is solidified, a high-temperature laser is used to form a plurality of openings on an upper surface of the molding material to expose an upper part of each of the solder balls. Next, an upper substrate is put on the molding material such that a solder on the lower surface of the upper substrate is in contact with the solder balls. At a first heating step, the solder and the solder balls are fused in an oven to make a number of interconnection elements. A reflow process is performed subsequent to the formation of a plurality of solder balls on the lower surface of the lower substrate. A singulation step is performed at the end of the process.

In the conventional manufacturing process, when the semiconductor package structure is moved to the oven, the lower surface of the upper substrate is in contact with, but not bonded to, the molding material, and the solder is in contact with, but not bonded to, the solder balls. Consequently, the upper substrate may move relative to the molding material during the transportation of the semiconductor package structure. Moreover, after the first heating step, the solder on the upper substrate and the solder balls of the lower substrate are bonded together; however, the lower surface of the upper substrate is in contact with, but not bonded to, the molding material. Accordingly, the upper substrate may easily warp after reflow and may even peel off, which adversely affects the reliability of resulting products.

In order to solve the above problems, a solution is provided. The solution is to use solder balls to bond an upper substrate to a lower substrate and then perform a molding process to form a molding material between the upper and lower substrates. Nevertheless, the molding material in such a molding process is injected from a side of the upper and lower substrates into a space between the upper and lower substrates, and the solder balls may affect the flow of the molding material, which may lead to an uneven distribution of the fillers within the molding material. Also, when a liquid state (A-stage) molding material is injected through a mold injection entrance from one side of the upper and lower substrates to the other side of the upper and lower substrates, it can be observed that larger-sized fillers can be conveyed farther than smaller-sized fillers by the liquid state molding material, and, thus, after a curing process (from A-stage to C-stage), the larger-sized fillers can be mostly positioned at the side farther away from the mold injection entrance, and the smaller-sized fillers can be mostly positioned at the side near the mold injection entrance. Moreover, in order to make the molding material pass through a channel between the die and the upper substrate in such a process, solder balls of a predetermined height are used. Accordingly, the reduction of the size of each of the solder balls as well as in the distance between every two of the solder balls is limited.

SUMMARY

One aspect of the present disclosure is directed to a semiconductor package structure. In one of the embodiments, the semiconductor package structure includes a first substrate, a second substrate, a die, a plurality of interconnection elements and an encapsulation material. The first substrate includes an upper surface and a plurality of first substrate upper conductive pads. The second substrate includes a lower surface and a plurality of second substrate lower conductive pads, wherein the upper surface of the first substrate faces the lower surface of the second substrate. The die is electrically connected to the upper surface of the first substrate. The plurality of interconnection elements connect the first substrate upper conductive pads and the second substrate lower conductive pads. The encapsulation material is between the upper surface of the first substrate and the lower surface of the second substrate, and the encapsulation material encapsulates the die and the interconnection elements, wherein the encapsulation material defines a plurality of accommodation spaces to accommodate the interconnection elements, and the profile of each of some of the accommodation spaces is defined by a respective one of the interconnection elements.

Another aspect of the present disclosure is directed to a semiconductor package structure. In one of the embodiments, the semiconductor package structure comprises a first substrate, a second substrate, a die, a plurality of interconnection elements and an encapsulation material. The first substrate includes an upper surface and a plurality of first substrate upper conductive pads. The second substrate includes a lower surface and a plurality of second substrate lower conductive pads, wherein the upper surface of the first substrate faces the lower surface of the second substrate. The die is electrically connected to the upper surface of the first substrate. The plurality of interconnection elements connect the first substrate upper conductive pads and the second substrate lower conductive pads. The encapsulation material is between the upper surface of the first substrate and the lower surface of the second substrate, and the encapsulation material encapsulates the die and the interconnection elements, wherein the encapsulation material defines a plurality of accommodation spaces; and wherein a difference between a surface roughness of the encapsulation material that forms the sidewall of each accommodation space and a surface roughness of the interconnection elements ranges from about 0 to about 1.5 μm.

Another aspect of the present disclosure is directed to a semiconductor process. In one of the embodiments, the semiconductor process includes the following: (a) electrically connecting a die to an upper surface of a first substrate, wherein the first substrate further includes a plurality of first substrate upper conductive pads, the first substrate upper conductive pads being exposed on the upper surface of the first substrate; (b) forming a plurality of first conductive parts on the first substrate upper conductive pads; (c) applying an encapsulation material on the upper surface of the first substrate to encapsulate the die and the first conductive parts, wherein the encapsulation material is a B-stage adhesive; (d) forming a plurality of openings on the encapsulation material to expose the first conductive parts; (e) pressing a second substrate onto the encapsulation material to adhere a lower surface of the second substrate to the encapsulation material, wherein the second substrate further includes a plurality of second substrate lower conductive pads and a plurality of second conductive parts; wherein at least one of the first conductive parts and the second conductive parts includes a solder; wherein the second substrate lower conductive pads are exposed on the lower surface of the second substrate; wherein the second conductive parts are on the second substrate lower conductive pads; and wherein the solder is in contact with the first conductive parts and the second conductive parts; and (f) heating to fuse the solder to form a plurality of interconnection elements and solidify the encapsulation material to form a C-stage adhesive.

In one of the embodiments, the lower surface of the second substrate adheres to the encapsulation material; accordingly, the second (e.g., upper) substrate does not move relative to the encapsulation material during the transportation of the semiconductor package structure to the next station. Moreover, subsequent to the heating operation, the encapsulation material is capable of adhering to the lower surface of the second substrate. Therefore, although the coefficient of thermal expansion (CTE) of each of the first substrate, the second substrate, the encapsulation material and the interconnection elements is different from one another, the first substrate and the second substrate are adhered to the encapsulation material such that the warpage behavior of the first substrate is in compliance with that of the second substrate during reflow (for example, both the first and second substrates may be bent upward or downward at the same time). Accordingly, the first conductive parts may remain in good contact with the second conductive parts to enhance the reliability of resulting products.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
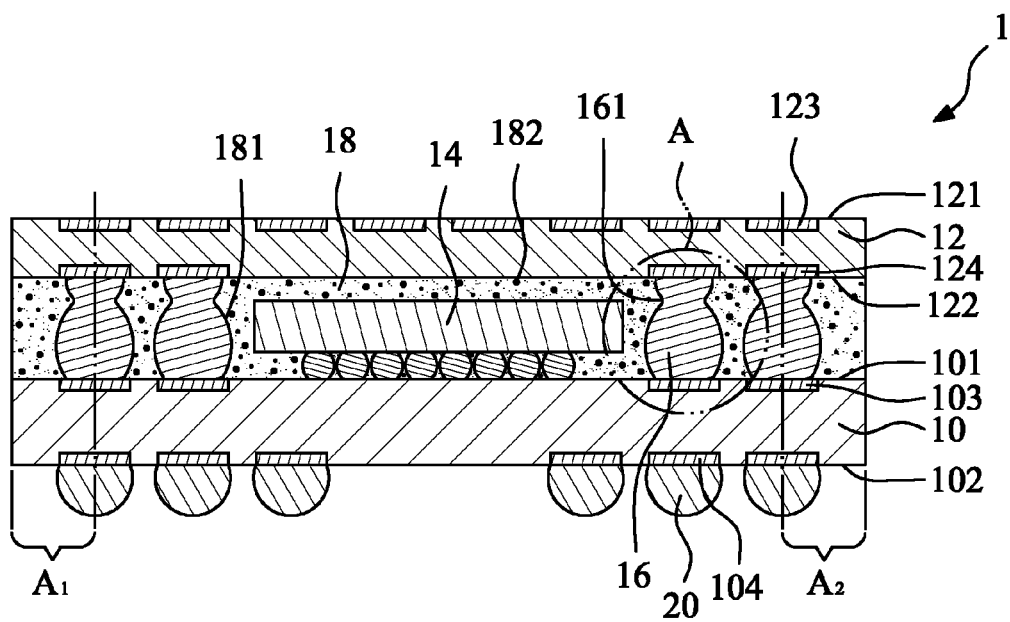
FIG. 1 illustrates a cross-sectional view of a semiconductor package structure according to an embodiment of the present disclosure.

FIG. 1 illustrates a cross-sectional view of a semiconductor package structure according to an embodiment of the present disclosure. The semiconductor package structure 1 includes a first substrate 10, a second substrate 12, a die 14, a plurality of interconnection elements 16, an encapsulation material 18 and a plurality of lower solder balls 20.

The first substrate 10 includes an upper surface 101, a lower surface 102, a plurality of first substrate upper conductive pads 103 and a plurality of first substrate lower conductive pads 104. In this embodiment, the first substrate 10 is a package substrate, the first substrate lower conductive pads 104 are exposed on the lower surface 102 of the first substrate 10, and the first substrate upper conductive pads 103 are exposed on the upper surface 101 of the first substrate 10. The first substrate lower conductive pads 104 are electrically connected to the first substrate upper conductive pads 103.

The second substrate 12 includes an upper surface 121, a lower surface 122, a plurality of second substrate upper conductive pads 123 and a plurality of second substrate lower conductive pads 124. The upper surface 101 of the first substrate 10 faces the lower surface 122 of the second substrate 12. In this embodiment, the second substrate 12 is a package substrate or an interposer, the second substrate upper conductive pads 123 are exposed on the upper surface 121 of the second substrate 12, and the second substrate lower conductive pads 124 are exposed on the lower surface 122 of the second substrate 12. The second substrate upper conductive pads 123 are electrically connected to the second substrate lower conductive pads 124.

The die 14 is electrically connected to the upper surface 101 of the first substrate 10. In this embodiment, the die 14 is adhered to the upper surface 101 of the first substrate 10 by using a flip-chip bonding technology. The interconnection elements 16 are connected to the first substrate upper conductive pads 103 and the second substrate lower conductive pads 124. In this embodiment, a first conductive part (e.g., a solder ball) and a second conductive part (e.g., a pre-solder) are fused to form each of the interconnection elements 16. Each of the interconnection elements 16 includes a neck part 161. The interconnection elements 16 are used to electrically connect the first substrate upper conductive pads 103 and the second substrate lower conductive pads 124.

A trace (not shown) may be used to electrically connect the first substrate upper conductive pads 103 and the first substrate lower conductive pads 104 or to electrically connect the second substrate upper conductive pads 123 and the second substrate lower conductive pads 124. The second substrate lower conductive pads 124 may be coplanar with the trace or be formed on the trace depending on the desired implementation.

The encapsulation material 18 is deposited between the upper surface 101 of the first substrate 10 and the lower surface 122 of the second substrate 12 and encapsulates the die 14 and the interconnection elements 16. The encapsulation material 18 adheres to both the upper surface 101 of the first substrate 10 and the lower surface 122 of the second substrate 12, and the adhesion force between the encapsulation material 18 and the upper surface 101 of the first substrate 10 is substantially the same as that between the encapsulation material 18 and the lower surface 122 of the second substrate 12. In this embodiment, the encapsulation material 18 is a non-conductive film (NCF), a non-conductive paste (NCP) or an Ajinomoto Build-up film (ABF). The encapsulation material 18 may include, for example, a polymer (e.g., polyimide, epoxy, or other resin, such as a thermosetting adhesive), a ceramic, or a combination of the foregoing. When the encapsulation material 18 is in a B-stage, the encapsulation material 18 adheres to both the upper surface 101 of the first substrate 10 and the lower surface 122 of the second substrate 12. Because the lower surface 122 of the second substrate 12 adheres to the encapsulation material 18, the second substrate 12 may not move relative to the encapsulation material 18 during the transportation of the semiconductor package structure to the next station. Moreover, subsequent to the heating operation, the encapsulation material 18 is capable of adhering to the lower surface 122 of the second substrate 12; accordingly, although the CTE of each of the first substrate 10, the second substrate 12, the encapsulation material 18 and the interconnection elements 16 is different from one another, the first substrate 10 and the second substrate 12 are adhered to the encapsulation material 18 such that the warpage behavior of the first substrate 10 is in compliance with that of the second substrate 12 during reflow (for example, both the first substrate 10 and second substrate 12 may be bent upward (a concave curve) or downward (a convex curve) at the same time). Accordingly, first conductive parts of the interconnection element 16 (e.g., solder balls) may remain in good contact with second conductive parts of the interconnection elements 16 (e.g., pre-solder) to enhance the reliability of the products.

In this embodiment, the encapsulation material 18 is not a conventional molding compound. Due to the demolding or mold release operation in the conventional process, a layer of wax would be coated on the back of the die 14. Because of the molding operation, the wax on the back of the die 14 may adversely affect the adhesion of the conventional molding compound to the die 14. In this embodiment, the encapsulation material 18 is in direct contact with the back of the die 14 without wax therebetween to facilitate the adhesion of the encapsulation material 18 to the die 14.

In this embodiment, the encapsulation material 18 defines a plurality of accommodation spaces 181 to accommodate the interconnection elements 16. The profile of each of some of the sidewalls of the accommodation spaces 181 is conformal to each of the interconnection elements 16, and the outer surface of each of at least part of the interconnection elements 16 is in contact with the sidewall of each of the accommodation spaces 181, i.e., the profile of each of some of the accommodation spaces 181 is defined by each of the interconnection elements 16. Accordingly, each of the interconnection elements 16 is tightly encapsulated by the encapsulation material 18. In this embodiment, the surface roughness (Ra) of the sidewalls of the accommodation spaces 181 ranges from about 1 µm to about 2 µm, and the surface roughness of the interconnection elements 16 ranges from about 0.5 µm to about 1 µm. In other words, the difference between the surface roughness of the encapsulation material 18 that forms the sidewalls of the accommodation spaces 181 and the surface roughness of the interconnection elements 16 ranges from about 0 to about 1.5 µm. Preferably, the profile of the sidewall of each of the accommodation spaces 181 is conformal to each interconnection element 16, and the whole outer surface of each interconnection element 16 is in contact with the sidewall of each accommodation space 181, i.e., the profile of each accommodation space 181 is defined by each interconnection element 16.

The encapsulation material 18 further includes a plurality of fillers 182 having different radii or sizes. Since the encapsulation material 18 is applied in a B-stage, the fillers 182 do not have to flow from one side of the encapsulation material 18 toward another side of the encapsulation material 18 or through a molding channel, and the fillers 182 are substantially uniformly distributed within the encapsulation material 18 but out of regions occupied by the interconnection elements 16. Specifically, a size distribution of the fillers 182 is spatially uniform in the encapsulation material 18, namely in which the size distribution of the fillers 182 in different parts of the encapsulation material 18 is substantially the same. In addition, the filler content (wt %, which is obtained by dividing the weight of the fillers 182 by the weight of the encapsulation material 18) of the fillers 182 in different parts of the encapsulation material 18 is substantially the same. The uniformly distributed fillers 182 may facilitate the uniformity of the openings in the encapsulation material 18 formed by laser in the manufacturing process, and may promote greater ease of the manufacturing process by allowing common parameter settings to be used for laser drilling when forming different openings. The uniformity of the openings in the encapsulation material 18 may facilitate the uniformity of the interconnection elements 16 and enhance the reliability of the package structure 1. In this embodiment, the average radius or size of the fillers 182 is smaller than about 5 µm.

Moreover, since the fillers 182 do not have to flow from one side of the encapsulation material 18 toward another side of the encapsulation material 18 or through a molding channel, the narrowest channel, located between the second substrate 12 and the die 14, is not necessary to be defined as greater than the maximum radius of the fillers 182. Therefore, the thickness between the second substrate 12 and the die 14 is reduced, and the entire thickness of the encapsulation material 18 is reduced. In one embodiment, the thickness of the encapsulation material 18 between the second substrate 12 and the die 14 is not greater than the maximum radius among the fillers 182. In another embodiment, the thickness of the encapsulation material 18 between the second substrate 12 and the die 14 is smaller than about 20 µm, such as no greater than about 18 µm, or no greater than about 15 µm.

Still referring to FIG. 1, section $A_1$ and section $A_2$ of the encapsulation material 18 are sampled to illustrate the distribution of the fillers 182 in encapsulation material 18, wherein section $A_1$ is the part from the leftmost side of the encapsulation material 18 to the right of a predetermined distance, the predetermined distance being 10% of the maximum width of the encapsulation material 18 spanning from the leftmost side to the rightmost side of the encapsulation material 18, and section $A_2$ is the part from the rightmost side of the encapsulation material 18 to the left of the same predetermined distance. The distribution of the particle size in section $A_1$ is substantially the same as that in section $A_2$ and the filler content (wt %, which is obtained by dividing the weight of the fillers 182 by the weight of the encapsulation material 18) in section $A_1$ is substantially the same as that in section $A_2$. Parts of sections $A_1$ and $A_2$ are further sampled for measurement and controlled at the condition to make the part of section $A_1$ and the part of section $A_2$ respectively include approximately a hundred fillers, and the measurement result shows that the distribution of the particle size in the part of section $A_1$ is substantially the same as that in the part of section $A_2$ and the filler content (wt %, which is obtained by dividing the weight of the fillers 182 by the weight of the encapsulation material 18) in the part of section $A_1$ is substantially the same as that in the part of section $A_2$. In one embodiment, an absolute value of the difference between an average particle size in section $A_1$ (or in the part of section $A_1$) and an average particle size in section $A_2$ (or in the part of section $A_2$), when expressed as a percentage relative to either the average particle size in section $A_1$ (or in the part of section $A_1$) or the average particle size in section $A_2$ (or in the part of section $A_2$), is less than or equal to 10%, such as less than or equal to 5%, less than or equal to 4%, less than or equal to 3%, less than or equal to 2%, or less than or equal to 1%. In one embodiment, an absolute value of the difference between the filler content in section $A_1$ (or in the part of section $A_1$) and the filler content in section $A_2$ (or in the part of section $A_2$), when expressed as a percentage relative to either the filler content in section $A_1$ (or in the part of section $A_1$) or the filler content in section $A_2$ (or in the part of section $A_2$), is less than or equal to 10%, such as less than or equal to 5%, less than or equal to 4%, less than or equal to 3%, less than or equal to 2%, or less than or equal to 1%.

The lower solder balls 20 are located on the first substrate lower conductive pads 104 to electrically connect to an external element.

Figure 2:
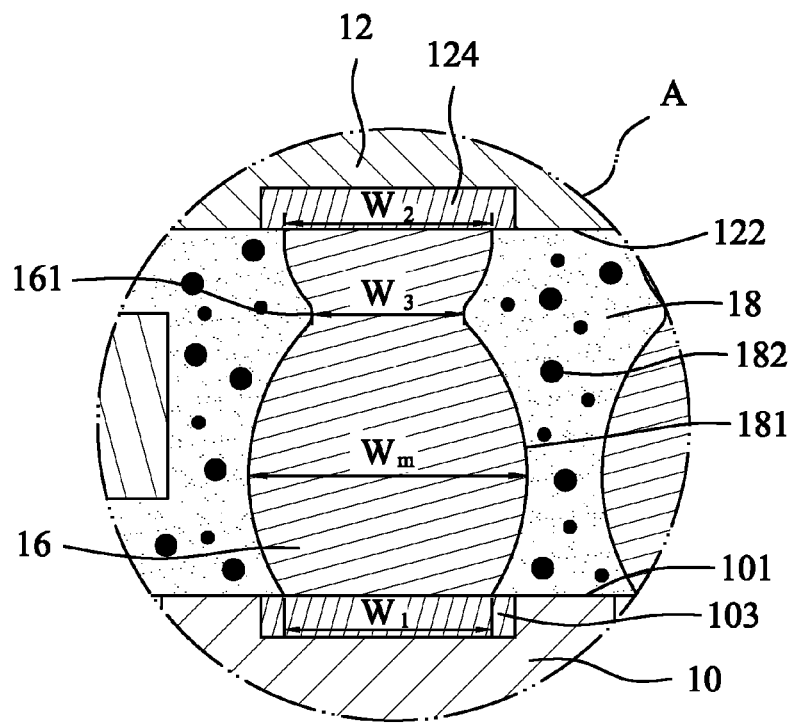
FIG. 2 illustrates an enlarged view of section A shown in FIG. 1 according to an embodiment of the present disclosure.

FIG. 2 illustrates an enlarged view of section A shown in FIG. 1 according to an embodiment of the present disclosure. In this embodiment, the cross-section of each interconnection element 16 has a profile similar to the cross-section of a gourd. The contact area of each interconnection element 16 that is in contact with each of the first substrate upper conductive pads 103 has a first width $W_1$, the contact area of each interconnection element 16 that is in contact with each of the second substrate lower conductive pads 124 has a second width $W_2$. Each neck part 161 has a third width $W_3$, and each interconnection element 16 has a maximum width $W_m$. The maximum width $W_m$ is greater than the third width $W_3$. The first width $W_1$ is approximately the same as the second width $W_2$ (e.g., $|W_1-W_2|/W_1$ or $|W_1-W_2|/W_2$ is less than or equal to 10%, less than or equal to 5%, less than or equal to 4%, less than or equal to 3%, less than or equal to 2%, or less than or equal to 1%), and the maximum width $W_m$ is greater than the first width $W_1$ and the second width $W_2$. The first width $W_1$ may be greater than the third width $W_3$, and the second width $W_2$ may be greater than the third width $W_3$. In this embodiment, the first conductive part of the interconnection element 16 (e.g., a solder ball) and the second conductive part of the interconnection element 16 (e.g., pre-solder) are fused to make each of the interconnection elements 16 so that the maximum width $W_m$ of each interconnection element 16 can be reduced. Accordingly, the pitch of every two of the interconnection elements 16, which is the sum of the maximum width $W_m$ of an interconnection element 16 and the shortest distance between every two interconnection elements 16, is reduced to be suitable for a fine pitch circuit.

Figure 3:
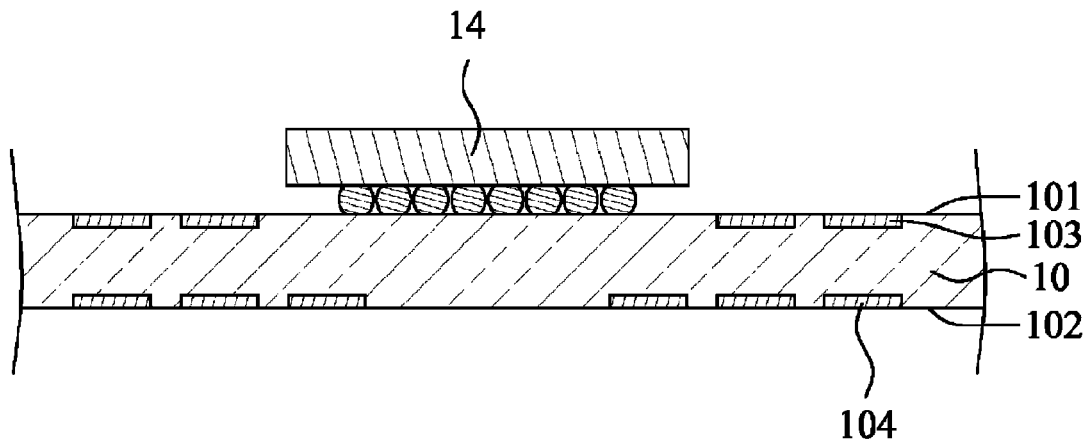
FIG. 3, FIG. 4, FIG. 5, FIG. 6, FIG. 7, FIG. 8, FIG. 9, and FIG. 10 illustrate a semiconductor process according to another embodiment of the present disclosure.

FIGS. 3 to 10 illustrate a semiconductor manufacturing process according to another embodiment of the present disclosure. Referring to FIG. 3, a die 14 and a first substrate 10 are provided. The first substrate 10 includes an upper surface 101, a lower surface 102, a plurality of first substrate upper conductive pads 103 and a plurality of first substrate lower conductive pads 104. In this embodiment, the first substrate 10 is a package substrate, the first substrate lower conductive pads 104 are exposed on the lower surface 102 of the first substrate 10, and the first substrate upper conductive pads 103 are exposed on the upper surface 101 of the first substrate 10. The first substrate lower conductive pads 104 are electrically connected to the first substrate upper conductive pads 103. The die 14 is electrically connected to the upper surface 101 of the first substrate 10. In this embodiment, the die 14 is adhered to the upper surface 101 of the first substrate 10 by using a flip-chip bonding technology.

Figure 4:
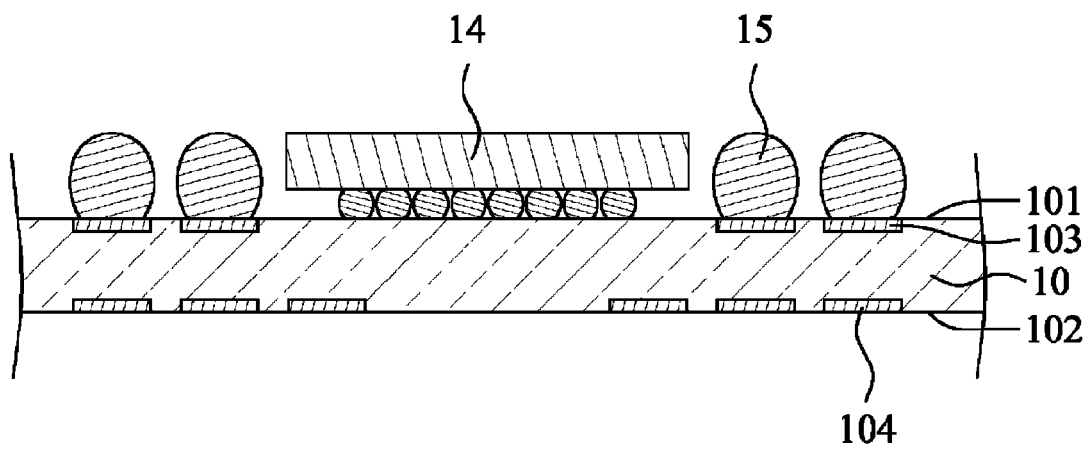

Referring to FIG. 4, a plurality of first conductive parts 15 are formed or applied on the first substrate upper conductive pads 103, and the first conductive parts 15 are formed or applied around the die 14. In this embodiment, the first conductive parts 15 are a plurality of solder balls. However, in another embodiment, the first conductive parts 15 may be copper pillars or other metal pillars.

Figure 5:
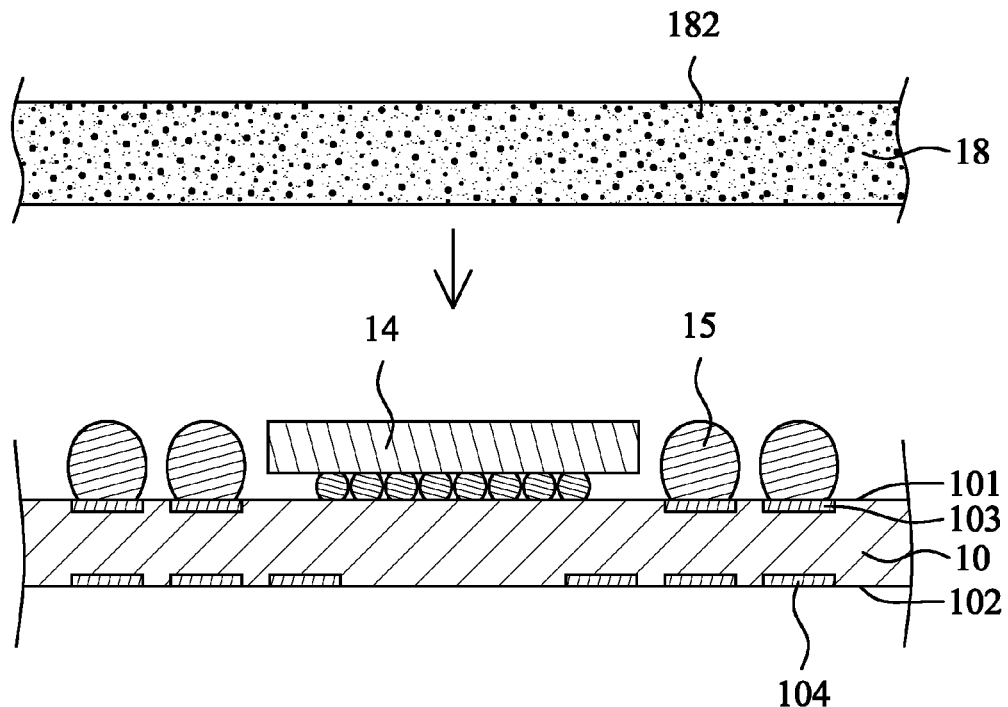

Referring to FIG. 5, an encapsulation material 18 is provided. In this embodiment, the encapsulation material 18 is an NCF, an NCP or an ABF. The encapsulation material 18 includes a plurality of fillers 182 having different radii or sizes. The fillers 182 are substantially uniformly distributed in the encapsulation material 18. At this time, the encapsulation material 18 is in a B-stage (e.g., an intermediate stage or a partially or not fully cured stage).

Figure 6:
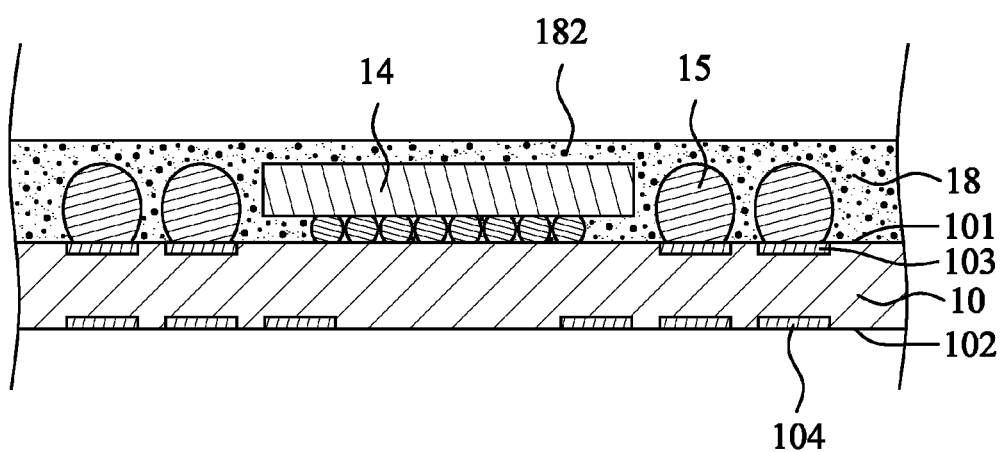

Referring to FIG. 6, the encapsulation material 18 is applied on the upper surface 101 of the first substrate 10 to encapsulate the die 14 and the first conductive parts 15. At this time, the encapsulation material 18 is still in a B-stage. In this embodiment, the encapsulation material 18 is upwardly or downwardly formed on the upper surface 101 of the first substrate 10 through laminating, pressing or printing. Accordingly, the first conductive parts 15 do not affect the flow of the fillers 182 in the encapsulation material 18. Since at this time the encapsulation material 18 is still in a B-stage, the fillers 182 do not flow from one side of the encapsulation material 18 toward another side of the encapsulation material 18 or through a molding channel, the fillers 182 may still be substantially uniformly distributed in the encapsulation material 18.

Figure 7:
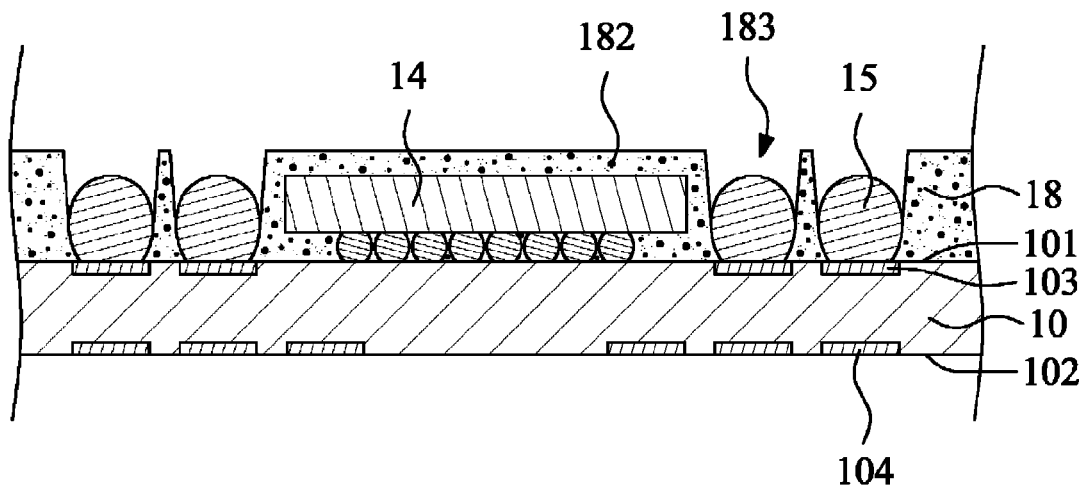

Referring to FIG. 7, a plurality of openings 183 are formed in the encapsulation material 18 to expose the upper part of the first conductive parts 15. In this embodiment, a low-temperature laser is used to form the openings 183. At this time, the encapsulation material 18 is still in a B-stage.

Figure 8:
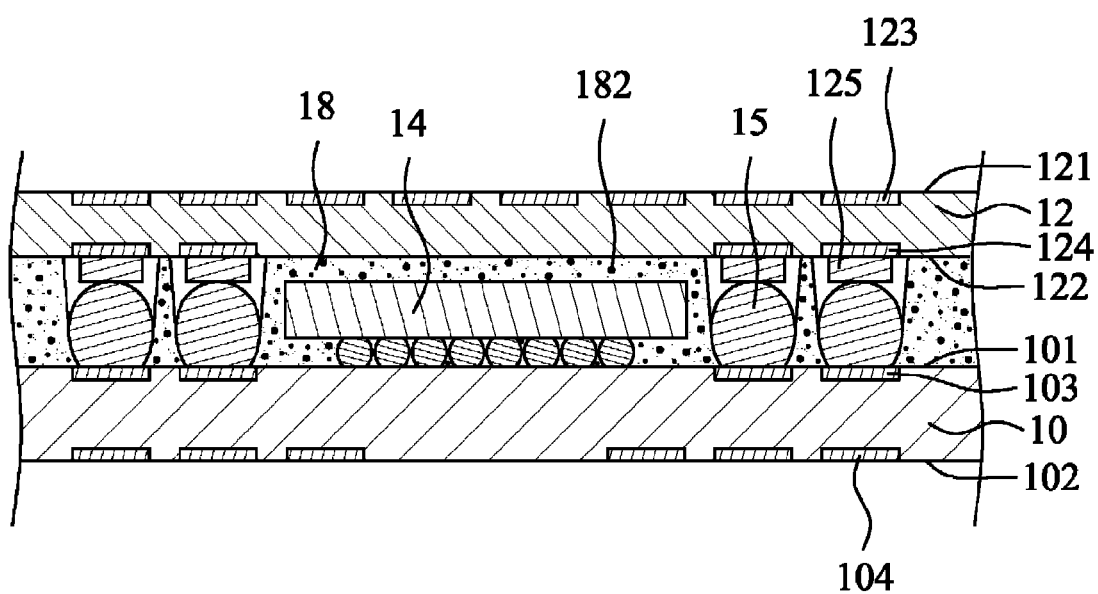

Referring to FIG. 8, a second substrate 12 is provided. The second substrate 12 includes an upper surface 121, a lower surface 122, a plurality of second substrate upper conductive pads 123, a plurality of second substrate lower conductive pads 124 and a plurality of second conductive parts 125. The lower surface 122 of the second substrate 12 faces the upper surface 101 of the first substrate 10. In this embodiment, the second substrate 12 is a package substrate or an interposer, the second substrate upper conductive pads 123 are exposed on the upper surface 121 of the second substrate 12, and the second substrate lower conductive pads 124 are exposed on the lower surface 122 of the second substrate 12. The second substrate upper conductive pads 123 are electrically connected to the second substrate lower conductive pads 124. The second conductive parts 125 are formed or applied on the second substrate lower conductive pads 124. In this embodiment, the second conductive parts 125 are a plurality of pre-solders. However, in another embodiment, the second conductive parts 125 may be copper pillars or other metal pillars. Moreover, at least one of the first conductive parts 15 and the second conductive parts 125 includes a solder. In this embodiment, the first conductive parts 15 and the second conductive parts 125 are solders. However, in another embodiment, if both the first conductive parts 15 and the second conductive parts 125 are copper pillars, one of the first conductive parts 15 and the second conductive parts 125 may include a solder, and the solder is in contact with the copper pillars of the first conductive parts 15 and the copper pillars of the second conductive parts 125 to facilitate the connection between the first conductive parts 15 and the second conductive parts 125.

Next, a downward pressure is applied on the second substrate 12 to press or laminate the second substrate 12 onto the encapsulation material 18. Because the encapsulation material 18 is still in a B-stage, the lower surface 122 of the second substrate 12 may adhere to the encapsulation material 18, and the adhesion force between the encapsulation material 18 and the upper surface 101 of the first substrate 10 is substantially the same as that between the encapsulation material 18 and the lower surface 122 of the second substrate 12. In an embodiment, an absolute value of the difference between the two adhesion forces, when expressed as a percentage relative to either of the two adhesion forces, is less than or equal to 10%, such as less than or equal to 5%, less than or equal to 4%, less than or equal to 3%, less than or equal to 2%, or less than or equal to 1%. In an embodiment, the encapsulation material 18 is heated to about 90° C. while the downward pressure is applied, and the encapsulation material 18 is flowable to fill any space. Moreover, because the encapsulation material 18 is pressed to encapsulate the die 14 and does not flow through the space between the lower surface 122 of the second substrate 12 and the back of the die 14, the space between the lower surface 122 of the second substrate 12 and the back of the die 14 may be reduced. Accordingly, the thickness of the entire package structure is greatly reduced by controlling the quantity of the encapsulation material 18 and the downward pressure.

Figure 9:
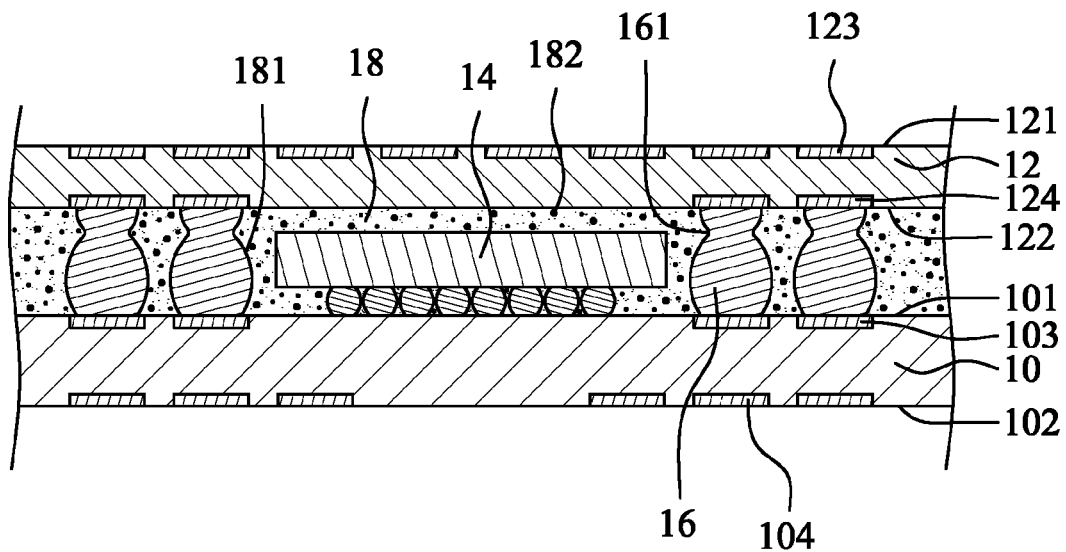

Referring to FIG. 9, an oven is used to firstly heat and fuse the solders to form the interconnection elements 16. The working temperature at this moment is approximately 245° C. The lower surface 122 of the second substrate 12 adheres to the encapsulation material 18, and accordingly the second substrate 12 does not move relative to the encapsulation material 18. In this embodiment, a first conductive part 15 (e.g., a solder ball) and a second conductive part 125 (e.g., a pre-solder) are solders, and the first conductive part 15 and the second conductive part 125 are fused to form each of the interconnection elements 16. Each of the interconnection elements 16 includes a neck part 161. The encapsulation material 18 may conformally encapsulate the interconnection elements 16, including the neck part 161 of each interconnection element 16. In other words, the profile of each accommodation space 181 formed in the encapsulation material 18 is defined by each interconnection element 16.

The encapsulation material 18 is solidified to C-stage (e.g., a final stage or a substantially fully cured stage) after the heating operation. The solidified encapsulation material 18 includes a plurality of accommodation spaces 181 to accommodate the interconnection elements 16, the profile of each of the sidewalls of some of the accommodation spaces 181 is conformal to each interconnection element 16, and the outer surface of each of some of the interconnection elements 16 is in contact with the sidewall of each of the accommodation spaces 181, i.e., the profile of each of some of the accommodation spaces 181 is defined by each interconnection element 16. Accordingly, each of the interconnection elements 16 is tightly encapsulated by the encapsulation material 18. In this embodiment, the surface roughness (Ra) of the sidewalls of the accommodation spaces 181 ranges from about 1 μm to about 2 μm, and the surface roughness of the interconnection elements 16 ranges from about 0.5 μm to about 1 μm. In other words, the difference between the surface roughness of the encapsulation material 18 that forms the sidewalls of the accommodation spaces 181 and the surface roughness of the interconnection elements 16 ranges from about 0 to about 1.5 μm. Preferably, the profile of the sidewall of each of the accommodation spaces 181 completely conforms to each interconnection element 16, and the whole outer surface of each of the interconnection elements 16 is in contact with the sidewall of each of the accommodation spaces 181, e.g., the profile of each accommodation space 181 is defined by each interconnection element 16.

Figure 10:
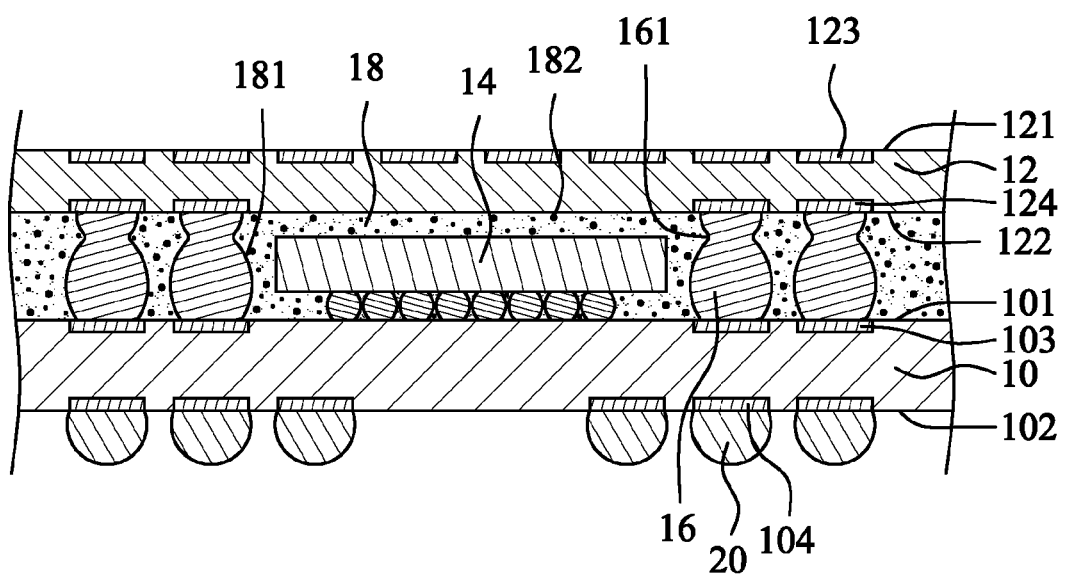

Referring to FIG. 10, a plurality of lower solder balls 20 are formed or applied on the first substrate lower conductive pads 104 and then are reflowed. The second substrate 12 is tightly adhered to the encapsulation material 18 and the first substrate 10. Accordingly, although the CTE of each of the first substrate 10, the second substrate 12, the encapsulation material 18 and the interconnection elements 16 is different from one another, the first substrate 10 and the second substrate 12 are adhered to the encapsulation material 18 such that the warpage behavior of the first substrate 10 is in compliance with that of the second substrate 12 during reflow (for example, both the first substrate 10 and second substrate 12 may be bent upward (a concave curve) or downward (a convex curve) at the same time). Accordingly, the first conductive parts 15 may remain in good contact with the second conductive parts 125 to enhance the reliability of the products. The singulation process is performed to form a plurality of semiconductor package structures as shown in FIG. 1. In the singulation process, because the second substrate 12 is tightly adhered to the encapsulation material 18 and the first substrate 10, the stress generated in the singulation process cannot cause the second substrate 12 to peel off, de-laminate or make the second substrate 12 move relative to the encapsulation material 18 or the first substrate 10.

Figure 11:
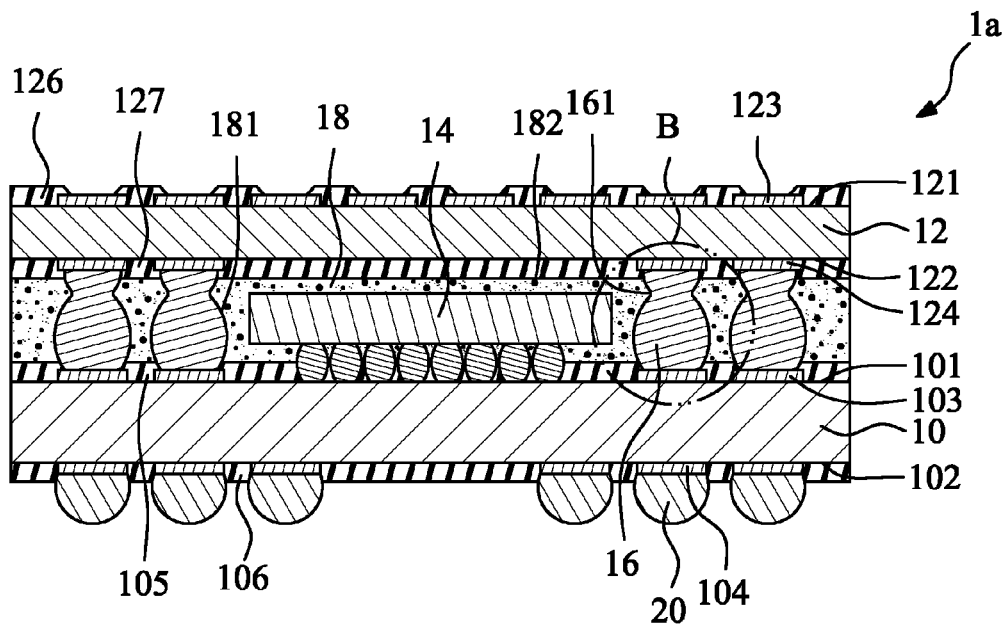
FIG. 11 illustrates a cross-sectional view of a semiconductor package structure according to another embodiment of the present disclosure.
Figure 12:
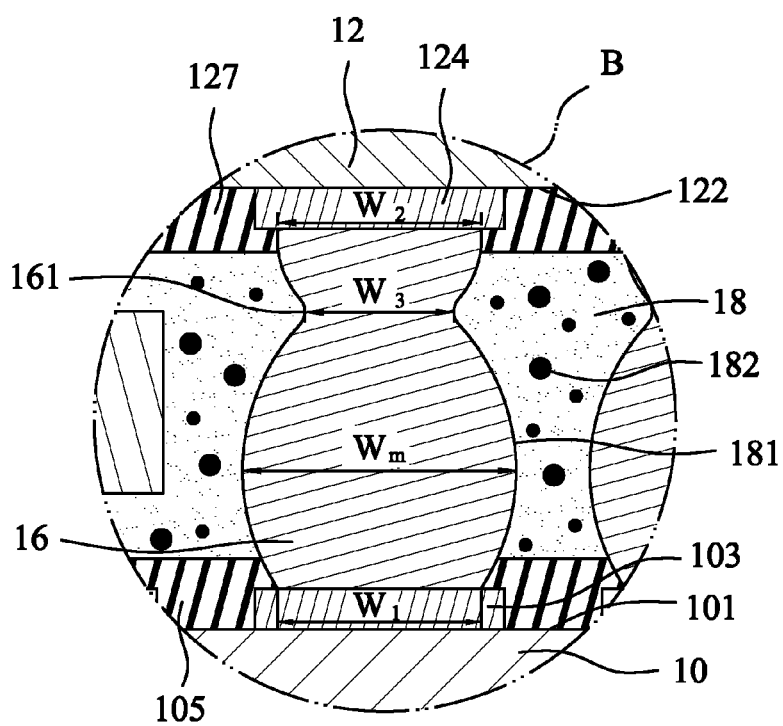
FIG. 12 illustrates an enlarged view of section B shown in FIG. 11 according to another embodiment of the present disclosure.

FIG. 11 illustrates a cross-sectional view of a semiconductor package structure according to another embodiment of the present disclosure, and FIG. 12 illustrates an enlarged view of section B shown in FIG. 11 according to another embodiment of the present disclosure. The semiconductor package structure 1a of this embodiment is similar to the semiconductor package structure 1 as shown in FIGS. 1 and 2 except that part of the upper surface 101 of the first substrate 10 of the semiconductor package structure 1a of this embodiment is covered by a first upper dielectric layer 105 and that part of the lower surface 102 of the first substrate 10 is covered by a first lower dielectric layer 106. The first substrate upper conductive pads 103 are exposed by the first upper dielectric layer 105, and the first substrate lower conductive pads 104 are exposed by the first lower dielectric layer 106. Moreover, part of the upper surface 121 of the second substrate 12 is covered by a second upper dielectric layer 126, and part of the lower surface 122 of the second substrate 12 is covered by a second lower dielectric layer 127. The second substrate upper conductive pads 123 are exposed by the second upper dielectric layer 126, and the second substrate lower conductive pads 124 are exposed by the second lower dielectric layer 127. In this embodiment, the adhesion force between the first upper dielectric layer 105 and the encapsulation material 18 is substantially the same as that between the second lower dielectric layer 127 and the encapsulation material 18. In an embodiment, an absolute value of the difference between the two adhesion forces, when expressed as a percentage relative to either of the two adhesion forces, is less than or equal to 10%, such as less than or equal to 5%, less than or equal to 4%, less than or equal to 3%, less than or equal to 2%, or less than or equal to 1%.

Figure 13:
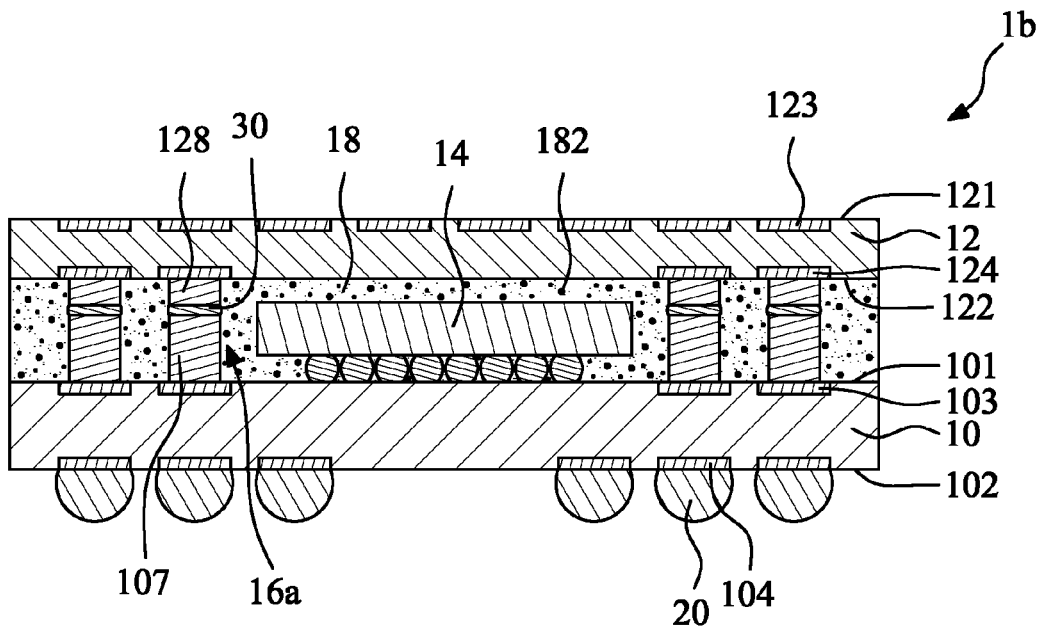
FIG. 13 illustrates a cross-sectional view of a semiconductor package structure according to another embodiment of the present disclosure.

FIG. 13 illustrates a cross-sectional view of a semiconductor package structure according to another embodiment of the present disclosure. The semiconductor package structure 1b of this embodiment is similar to the semiconductor package structure 1 as shown in FIGS. 1 and 2 except that each of the interconnection elements 16a of the semiconductor package structure 1b in this embodiment may include a first copper pillar 107 (first conductive part), a solder 30, and a second copper pillar 128 (second conductive part). The first copper pillar 107 is deposited on the first substrate upper conductive pads 103, and the second copper pillar 128 is deposited on the second substrate lower conductive pads 124. The first copper pillar 107 and the second copper pillar 128 are not fused together but are connected by the solder 30. The profile of each accommodation space in the encapsulation material 18 is still defined by each interconnection element 16a.

Figure 14:
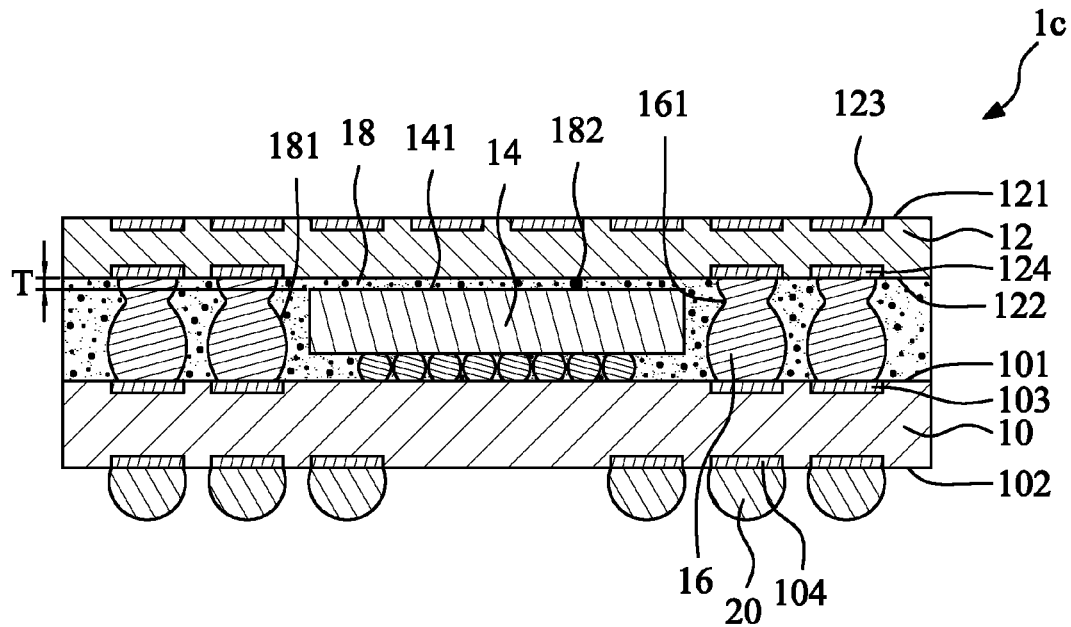
FIG. 14 illustrates a cross-sectional view of a semiconductor package structure according to another embodiment of the present disclosure.

FIG. 14 illustrates a cross-sectional view of a semiconductor package structure according to another embodiment of the present disclosure. The semiconductor package structure 1c of this embodiment is similar to the semiconductor package structure 1 as shown in FIGS. 1 and 2 except that the thickness of the encapsulation material 18 between the lower surface 122 of the second substrate 12 and the upper surface 141 of the die 14 of the semiconductor package structure 1c in this embodiment is defined as T and that the thickness T is smaller than or equal to the maximum radius among the fillers 182. Alternatively, the thickness T may be zero such that the lower surface 122 of the second substrate 12 is in contact with the upper surface 141 of the die 14.

As used herein, the terms "substantially," "substantial," "approximately," and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure comprising:
a first substrate comprising an upper surface and a plurality of first substrate upper conductive pads;
a second substrate comprising a lower surface and a plurality of second substrate lower conductive pads, wherein the upper surface of the first substrate faces the lower surface of the second substrate;
a die electrically connected to the upper surface of the first substrate;
a plurality of interconnection elements connecting the first substrate upper conductive pads and the second substrate lower conductive pads; and
an encapsulation material including a plurality of fillers, disposed between the upper surface of the first substrate and the lower surface of the second substrate, the encapsulation material encapsulating the die and the interconnection elements and defining a plurality of accommodation spaces to accommodate respective ones of the interconnection elements, a profile of each of the accommodation spaces being defined by a respective one of the interconnection elements, wherein the encapsulation material is cured from a B-stage material, and
wherein a thickness of the encapsulation material including the fillers between the lower surface of the second substrate and a top surface of the die is smaller than about 20 micrometers.

2. The semiconductor package structure of claim 1, further comprising a first dielectric layer covering part of the upper surface of the first substrate; and further comprising a second dielectric layer covering part of the lower surface of the second substrate.

3. The semiconductor package structure of claim 1, wherein the first substrate further comprises a lower surface and a plurality of first substrate lower conductive pads, the first substrate lower conductive pads being exposed on the lower surface of the first substrate, and the first substrate upper conductive pads being exposed on the upper surface of the first substrate; and wherein the second substrate further comprises an upper surface and a plurality of second substrate upper conductive pads, the second substrate upper conductive pads being exposed on the upper surface of the second substrate, and the second substrate lower conductive pads being exposed on the lower surface of the second substrate.

4. The semiconductor package structure of claim 1, wherein a pre-solder and a solder ball are fused to form each of the interconnection elements.

5. The semiconductor package structure of claim 1, wherein a contact area of each interconnection element that is in contact with a respective first substrate upper conductive pad has a first width; wherein a contact area of each interconnection element that is in contact with a respective second substrate lower conductive pad has a second width;

wherein each interconnection element includes a neck part which has a third width; wherein each interconnection element has a maximum width; and wherein the maximum width is greater than the first width, the second width and the third width.

6. The semiconductor package structure of claim 1, wherein the profile of a sidewall of each accommodation space is conformal to a respective interconnection element; and wherein an outer surface of each interconnection element is in contact with the sidewall of a respective accommodation space.

7. The semiconductor package structure of claim 1, wherein the encapsulation material is a non-conductive film (NCF), or a non-conductive paste (NCP).

8. The semiconductor package structure of claim 1, wherein a size distribution of the fillers is spatially uniform in the encapsulation material.

9. The semiconductor package structure of claim 8, wherein the fillers are not deposited in the interconnection elements.

10. The semiconductor package structure of claim 1, wherein the encapsulation material comprises section A1 and section A2; wherein section A1 is the part from a leftmost side of the encapsulation material to the right of a predetermined distance, the predetermined distance being 10% of a maximum width of the encapsulation material, and section A2 is the part from a rightmost side of the encapsulation material to the left of the same predetermined distance; and wherein sections A1 and A2 are substantially the same with respect to a distribution of a particle size and a filler content in the encapsulation material.

11. A semiconductor package structure comprising:
a first substrate comprising an upper surface and a plurality of first substrate upper conductive pads;
a second substrate comprising a lower surface and a plurality of second substrate lower conductive pads, wherein the upper surface of the first substrate faces the lower surface of the second substrate;
a die electrically connected to the upper surface of the first substrate;
a plurality of interconnection elements connecting the first substrate upper conductive pads and the second substrate lower conductive pads; and
an encapsulation material deposited between the upper surface of the first substrate and the lower surface of the second substrate, the encapsulation material encapsulating the die and the interconnection elements, wherein the encapsulation material defines a plurality of accommodation spaces to accommodate respective ones of the interconnection elements, wherein a difference between a surface roughness of the encapsulation material that forms sidewalls of the accommodation spaces and a surface roughness of the interconnection elements ranges from 0 to 1.5 µm, and wherein the encapsulation material is cured from a B-stage material.

12. The semiconductor package structure of claim 11, further comprising a first dielectric layer covering part of the upper surface of the first substrate; and further comprising a second dielectric layer covering part of the lower surface of the second substrate.

13. The semiconductor package structure of claim 11, wherein the encapsulation material comprises a plurality of fillers, and wherein the fillers are not deposited in the interconnection elements.

14. A semiconductor package structure, comprising:
a first substrate comprising an upper surface and first substrate pads on the upper surface;
a second substrate comprising a lower surface and second substrate pads on the lower surface;
a plurality of interconnection elements in physical contact with respective first substrate pads and respective second substrate pads, wherein the interconnection elements each comprises two conductive parts fused together, with a neck formed between the fused parts;
an encapsulation material extending between the upper surface of the first substrate and the lower surface of the second substrate, and encapsulating the plurality of interconnection elements, wherein the encapsulation material includes fillers substantially uniformly distributed within the encapsulation material, and the encapsulation material is cured from a B-stage material; and
a die positioned on the upper surface of the first substrate;
wherein a thickness of the encapsulation material including the fillers between the lower surface of the second substrate and a top surface of the die is smaller than about 20 micrometers.

15. The semiconductor package structure of claim 14, wherein for each interconnection element that is in contact with a respective first substrate pad and a respective second substrate pad:
a contact area between the interconnection element and the respective first substrate pad has a first width;
a contact area between the interconnection element and the respective second substrate pad has a second width;
the neck has a third width;
the interconnection element has a maximum width; and
the maximum width is greater than the first width, the second width and the third width.

16. The semiconductor package structure of claim 14, wherein the encapsulation material is conformally in contact with an outer surface of each interconnection element.

* * * * *